(12) United States Patent
Fish

(10) Patent No.: US 8,235,747 B2
(45) Date of Patent: Aug. 7, 2012

(54) DEVICE AND METHOD OF INSTALLING CAPACITORS ON A UTILITY COMPANY'S POWER METER

(76) Inventor: Steven Bruce Fish, Port Orange, FL (US)

( * ) Notice: Subject to any disclaimer, the term of this patent is extended or adjusted under 35 U.S.C. 154(b) by 0 days.

(21) Appl. No.: 13/035,913

(22) Filed: Feb. 25, 2011

(65) Prior Publication Data
US 2011/0212648 A1    Sep. 1, 2011

Related U.S. Application Data

(60) Provisional application No. 61/307,976, filed on Feb. 25, 2010.

(51) Int. Cl.
*H01R 33/945* (2006.01)
(52) U.S. Cl. .......................... 439/517; 324/74
(58) Field of Classification Search .................. 439/517; 324/74
See application file for complete search history.

(56) References Cited

U.S. PATENT DOCUMENTS

| | | | | |
|---|---|---|---|---|
| 5,514,958 A * | 5/1996 | Germer | ............................ | 324/74 |
| 6,377,037 B1 * | 4/2002 | Burns et al. | .................... | 324/142 |
| 7,589,516 B2 * | 9/2009 | Rzehak et al. | ................. | 324/107 |
| 7,609,051 B2 * | 10/2009 | Fritz et al. | ...................... | 324/142 |
| 7,689,374 B2 * | 3/2010 | Rzehak | ............................ | 702/60 |
| 8,134,346 B1 * | 3/2012 | Huta et al. | ..................... | 323/211 |
| 2011/0203103 A1 * | 8/2011 | Fish | ............................. | 29/592.1 |
| 2011/0212648 A1 * | 9/2011 | Fish | ............................. | 439/517 |
| 2012/0026768 A1 * | 2/2012 | Lopez-Santillana | .......... | 363/126 |

* cited by examiner

*Primary Examiner* — Ross Gushi
(74) *Attorney, Agent, or Firm* — Hayworth, Chaney & Thomas, P.A.; Stephen C. Thomas; Robert A. Lynch

(57) ABSTRACT

The Invention relates to the field of power factor correction in general. Specifically, the Invention comprises a device for insertion between the power meter of an electrical utility supply and the load which is further comprised of an electrical capacitance that is sized by the method of the Invention to improve the electrical power factor of the system as measured at the meter. The benefits of the Invention include increased power factor, lower power consumption, lower energy costs, and ease of installation due to its novel plug-in packaging approach wherein a utility meter adapter embodiment of the present invention containing power factor correcting circuit capacitor(s) plugs between a utility meter and its meter socket. The device of the invention installs between the power meter and power meter receptacle without requiring significant effort or time for installation.

9 Claims, 9 Drawing Sheets

DEVICE AND METHOD OF INSTALLING CAPACITORS ON A UTILITY COMPANY'S POWER METER

CROSS REFERENCE TO RELATED APPLICATIONS

This patent application incorporates by reference, in its entirety, and claims the benefit of the filing date of U.S. Provisional Patent Application Ser. No. 61/307,976, DEVICE AND METHOD OF INSTALLING CAPACITORS ON A UTILITY COMPANY'S POWER METER, filing date Feb. 25, 2010.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISK

Not applicable.

BACKGROUND OF THE INVENTION

Field of the Invention

The Invention relates to the field of power factor correction in general. Specifically, the Invention comprises a power factor correcting adapter ("adapter") for insertion between the utility power meter ("meter") of an electrical utility supply and the load the adapter further being comprised of an internal reactive load, such as an electrical capacitance, that is sized by the method of the Invention to improve the electrical power factor of the system as measured at the meter. The benefits of the Invention include increased power factor, increased efficiency, reduced power consumption, reduced energy costs, and ease of installation due to its novel plug-in packaging approach. The device of the invention installs between the utility power meter and power meter receptacle without requiring significant effort, tools, or time for installation.

The power factor of an AC electric power system is defined as the ratio of the real power flowing to the load to the apparent power in the circuit, and is a dimensionless number between 0 and 1 (frequently expressed as a percentage, e.g. 0.5 pf=50% pf). Real power is the capacity of the circuit for performing work in a particular time. Apparent power is the product of the current and voltage of the circuit. Due to energy stored in the load and returned to the source, or due to a non-linear load that distorts the wave shape of the current drawn from the source, the apparent power will usually be greater than the real power in any real application.

In an electric power system, a load with a low power factor draws more current than a load with a high power factor for the same amount of useful power transferred. The higher currents in the low power factor system increase the energy lost in the distribution system, and require larger (i.e. more expensive) wires and other equipment. Because of the costs of larger equipment and wasted energy, electrical utilities will usually charge a higher cost to industrial or commercial customers where there is a low power factor.

Linear loads with low power factor (such as induction motors) can be corrected with a passive network of capacitors or inductors. Non-linear loads, such as rectifiers, distort the current drawn from the system. In such cases, active or passive power factor correction may be used to counteract the distortion and raise the power factor. The devices for correction of the power factor may be at a central substation, spread out over a distribution system, installed at the power service entrance of the facility, or built into power-consuming equipment.

It is usually desirable to adjust the power factor of a system to near 1.0. This power factor correction (PFC) is typically achieved by switching in or out banks of inductors or capacitors. For example the inductive effect of motor loads may be offset by locally connected capacitors. When reactive elements supply or absorb reactive power near the load, the apparent power is reduced.

Power factor correction may be applied by an electrical power transmission utility to improve the stability and efficiency of the transmission network. Correction equipment may be installed by individual electrical customers to reduce the costs charged to them by their electricity supplier. A high power factor is generally desirable in a transmission system to reduce transmission losses and improve voltage regulation at the load.

Power factor correction brings the power factor of an AC power circuit closer to 1 by supplying reactive power of opposite sign, adding capacitors or inductors which act to cancel the inductive or capacitive effects of the load, respectively. For example, the inductive effect of motor loads may be offset by locally connected capacitors. If a load had a capacitive value, inductors (also known as reactors in this context) are connected to correct the power factor. In the electricity industry, inductors are said to consume reactive power and capacitors are said to supply it, even though the reactive power is actually just moving back and forth on each AC cycle.

The reactive elements can create voltage fluctuations and harmonic noise when switched on or off. They will supply or sink reactive power regardless of whether there is a corresponding load operating nearby, increasing the system's no-load losses. In a worst case, reactive elements can interact with the system and with each other to create resonant conditions, resulting in system instability and severe overvoltage fluctuations. As such, reactive elements cannot simply be applied at will, and power factor correction is normally subject to engineering analysis or testing to appropriately size the reactive elements.

There are many offerings for capacitors to be installed in a residence, for example. Most such prior art solutions involve a "one size fits all" solution. Some involve plugging a capacitor into an electrical outlet, while others involve installation at the main breaker panel. However, no two facilities are comprised of exactly the same load: therefore to achieve a truly optimized power factor correction for a particular facility, it is desirable to ascertain the optimum value of capacitance for improving power factor. If the wrong value is installed, there can actually be an increase in electricity costs.

The concept of adding capacitance to correct for power factor is known in the art. One of the most typical applications is to install capacitor(s) at the service entrance of a facility. In many instances these capacitors may be a fixed value or they may comprise a system that switches capacitors in and out to keep the power factor within a certain range.

The adapter and method of the invention overcome the prior "one size fits all" power factor correction, and overcomes the difficulties of ascertaining the correct capacitance needed to optimize power factor correction, in a novel packaging approach that allows for quick, safe, simple, and inexpensive installation that is in accordance with building and trade codes. The adapter installs easily by simply plugging in between the standard utility power meter and the power meter socket on the service side of the power supply to the facility.

The usual electrical service coming in from the utility is 240-volts AC supplied as two 120-volt circuits 180-degrees out of phase on three wires, two hot and one neutral. These three wires carry first through a utility meter comprised of a round glass enveloped instrument with a spinning disk inside that shows the rate at which the home is consuming power. The face of the meter has several dials or other readouts that register the total power consumption in kilo-watt hours (kWh). After the meter, a main disconnect tandem circuit breaker connects to a distribution panel with many branch circuit breakers.

BRIEF SUMMARY OF THE INVENTION

The adapter of the invention is a novel device and method for implementing the solution of adding capacitance (or inductance or active power factor correction) to the service entrance (supply) of a facility, wherein a utility power meter adapter embodiment of the present invention containing a power factor correcting capacitor plugs between a utility power meter and its meter socket. The competitive edge this product offers is that it becomes much more cost effective to deploy a capacitor bank at the service entrance of a facility than is currently offered in the market. This product is attached between the utility meter and the standard meter base. The product is self-contained. It is attached by plugging into the existing meter base and is secured by a standard meter ring that locks the utility meter in place. The utility meter is plugged into the top of the adapter in a manner typical of the standard meter installation on a meter base.

The current technology involves installing a capacitor bank mounted in an electrical box. The electrical box is electrically connected to the service entrance, typically through a breaker. This involves mounting the capacitor bank with screws or bolts, adding electrical plumbing, knocking out a hole in the panel, and then making all the electrical connections (adding a breaker if necessary). Since the cost of labor is usually very significant, the adapter of the invention is an improvement on the state of the art. The adapter of the invention can be installed in under two minutes, the current methodology is typically to 60 minutes or more for a typical installation.

While the invention is described herein in terms of adding capacitance, an alternate embodiment of the invention is one that provides inductive reactive power factor correction. A further embodiment of the invention is one that provides active power factor correction by the use of a controlled switch network using, for example, Insulated Gate Bipolar Transistors (IGBTs).

DETAILED DESCRIPTION OF THE PREFERRED EMBODIMENTS

The present invention comprises a device and/or method that is comprised of one or more of the following structures and/or steps, which alone or in any combination may comprise patentable subject matter.

In accordance with one embodiment of the present invention, the invention may comprise a capacitor, or plurality of capacitors, housed in a plastic enclosure that fits between the electrical utility power meter and the power meter socket on the service side of a facility. The facility may be fed from single phase or multi-phase power mains. The original utility meter is pulled out of its socket of the electric infrastructure and the adapter is plugged in the place of the original utility power meter. The utility power meter is then plugged into the receiving receptacles of the plastic adapter. In this manner, the adapter is installed between the utility power meter and the power meter socket and continues in normal operation, with the adapter providing capacitive power factor correction.

Figure 1:
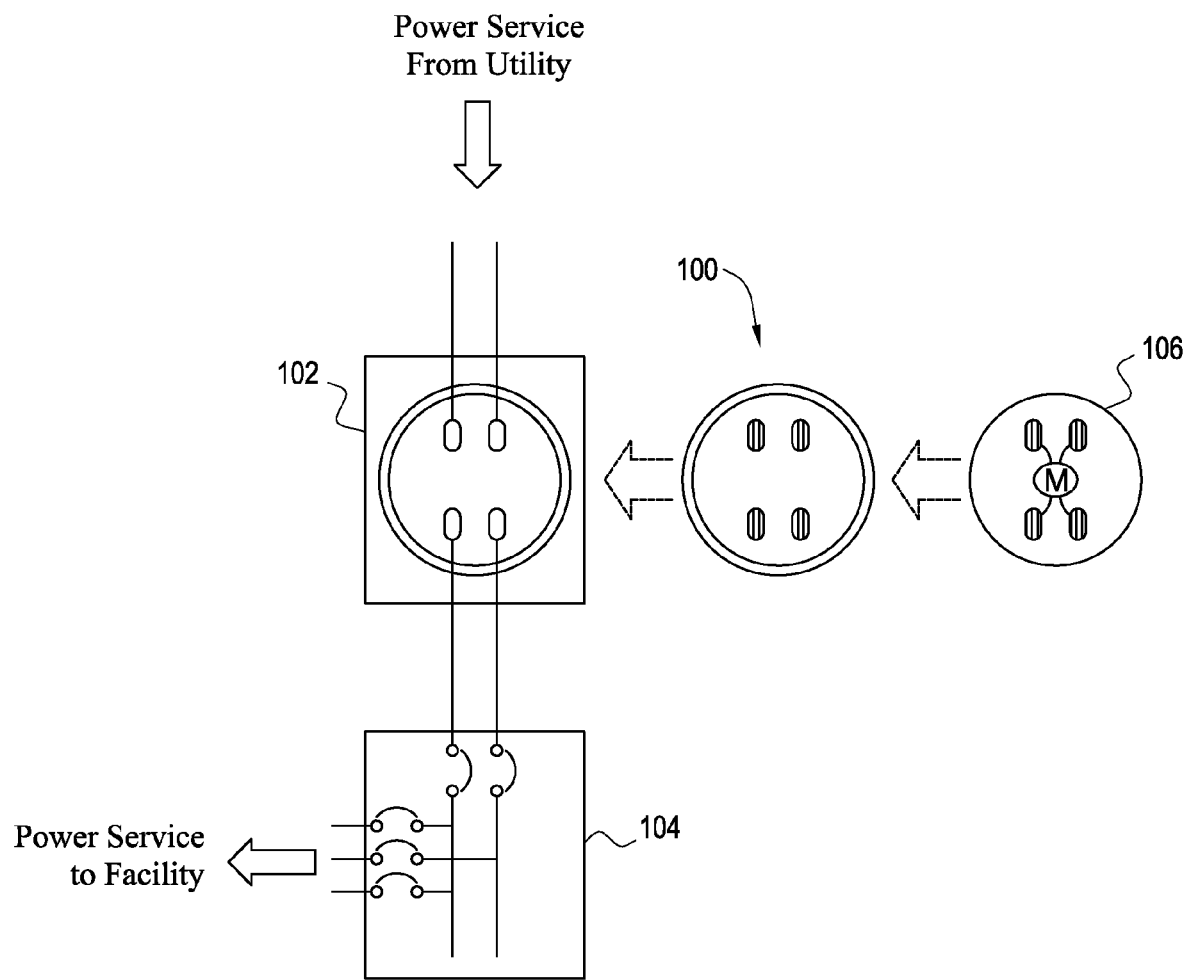
FIG. 1 is a schematic diagram of a pre-existing utility socket, meter, and main panel, and how an adapter embodiment of the present invention inserts between the pre-existing utility socket and the power meter. The AC neutral wiring is not shown to keep the illustration uncluttered.

FIG. 1 represents an adapter system embodiment of the present invention installed in a single phase system, and is referred to herein by the general reference numeral 100. The adapter 100 makes use of a pre-existing and conventional meter socket 102 and main distribution panel 104 that can be mounted flush inside a wall. A utility power meter 106 measures and registers power usage for a power utility billing purposes. The whole point of system 100 is to not disturb pre-existing meter sockets 102 and main distribution panels 104, nor require their upgrading or replacement in order for the power factor correcting capacitance to be installed in the system.

Figure 2:
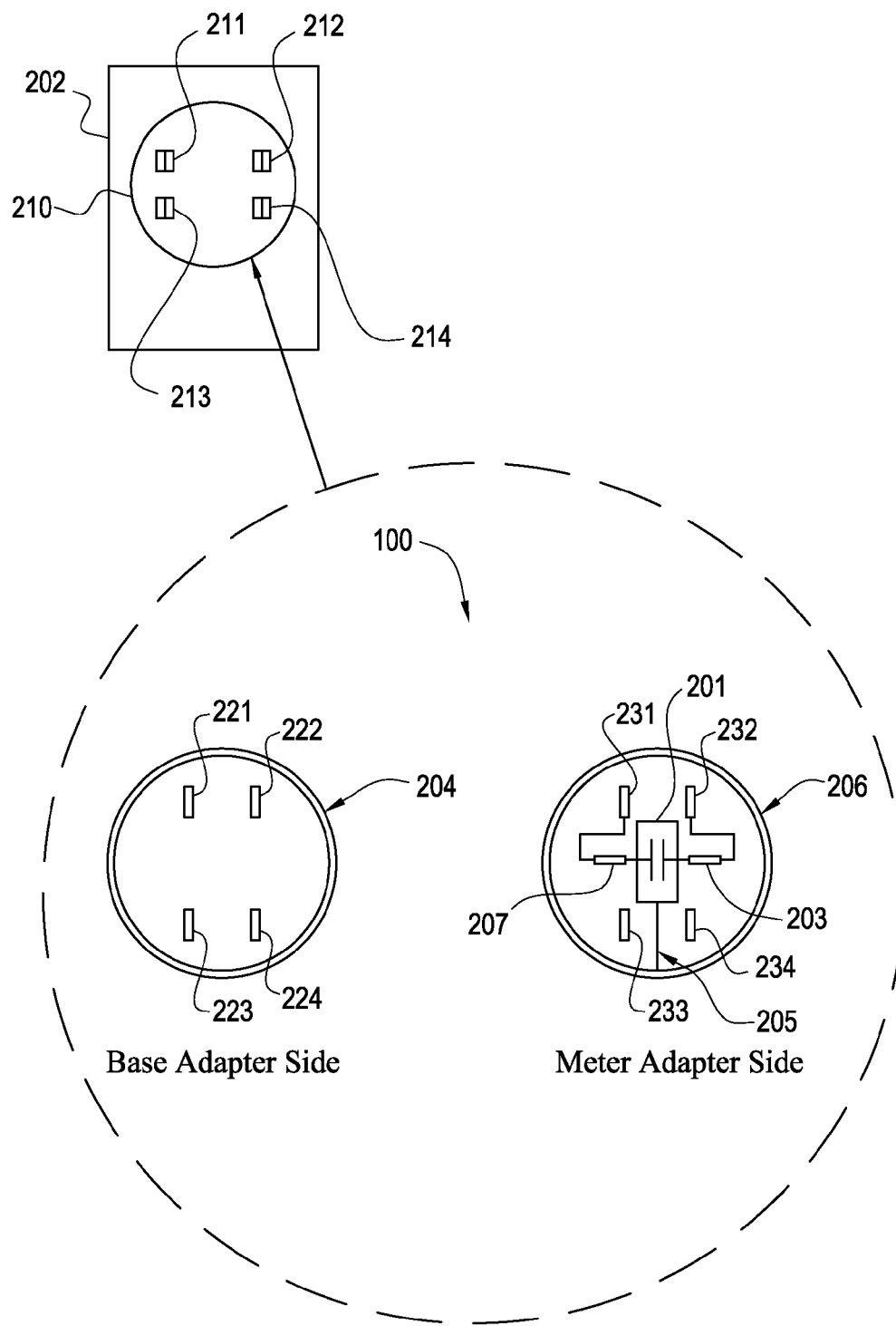
FIG. 2 depicts a schematic diagram of an adapter embodiment of the present invention and details the arrangement of jaw blades in the adapter that plug into the service panel and the jaw sockets that accept a utility meter on top. The capacitor(s) of the invention are depicted as mounted into the adapter.

FIG. 2 represents a supply side meter socket adapter embodiment of the present invention, and is referred to herein by the general reference numeral 100. The adapter 100 is intended to plug into a service panel 202 and to be retained by a standard ring on a lower flange 204. The meter itself is retained by another standard ring on an upper flange 206. An opening 210 in service panel 202 provides an access port in which a utility can be plugged into socket jaws 211-214. Instead of a meter, the adapter 100 plugs into socket jaws 211-214 with jaw blades 221-224. These are each electrically and physically extended into socket jaws 231-234 which accept the meter. Internal wiring brings the two AC hot to overcurrent devices, which may be, for example, fuses, 207 and 203. Capacitance 201, which may be at least one, or a plurality of capacitors, is electrically connected to overcurrent devices 207 and 203 via internal wiring. At least one neutral pigtail lead 205 is electrically connected to ground on the adapter, which is provided by at least one electrical contact on the adapter housing and which is in electrical contact with the service panel ("panel") ground when the adapter is plugged into the panel.

Figure 3A:
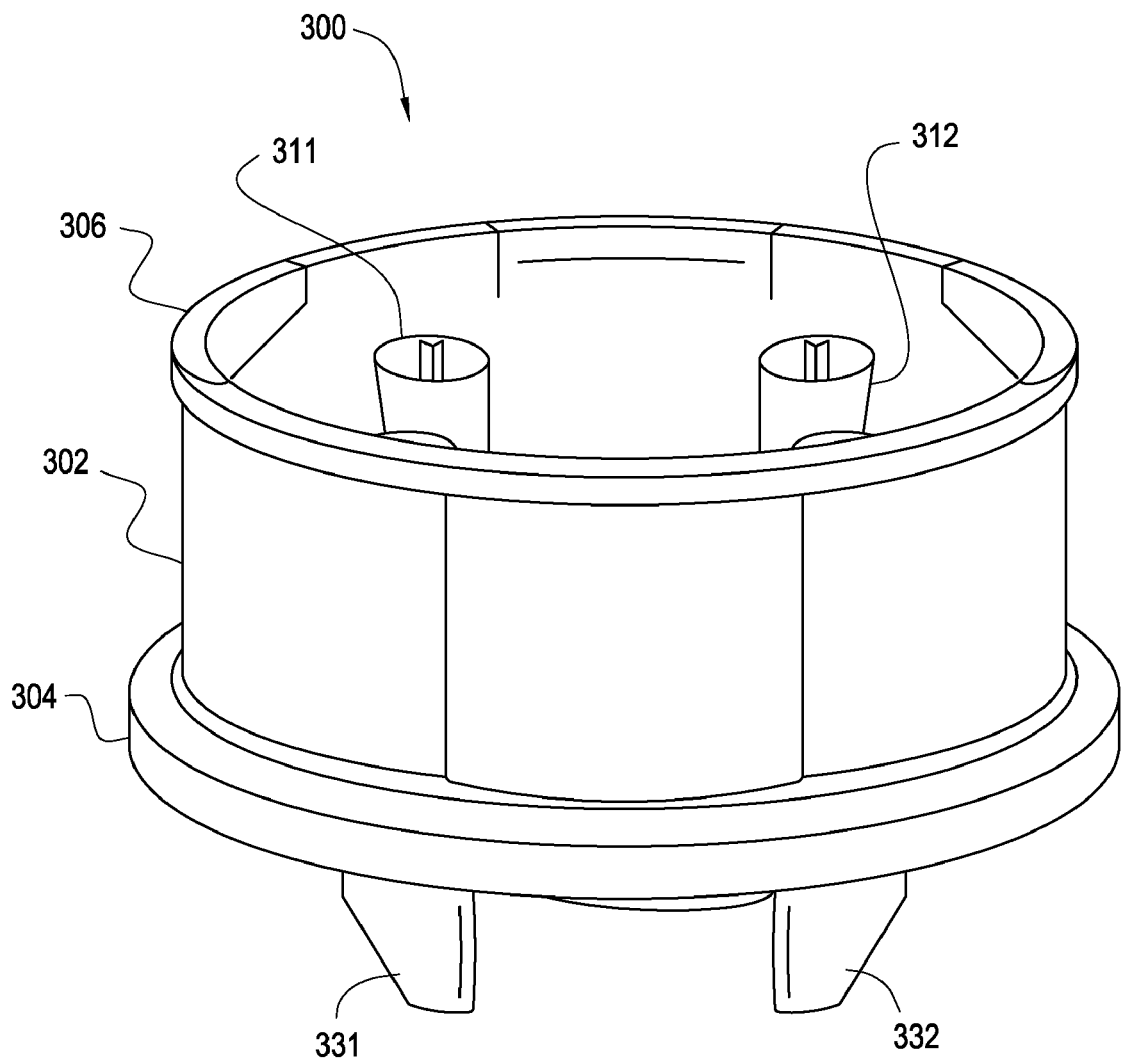
FIG. 3A is a perspective diagram of an adapter embodiment of the present invention constructed of heavy duty plastic or properly insulated and grounded metal and sized to fit between both a meter socket and its corresponding round glass utility meter.
Figure 3B:
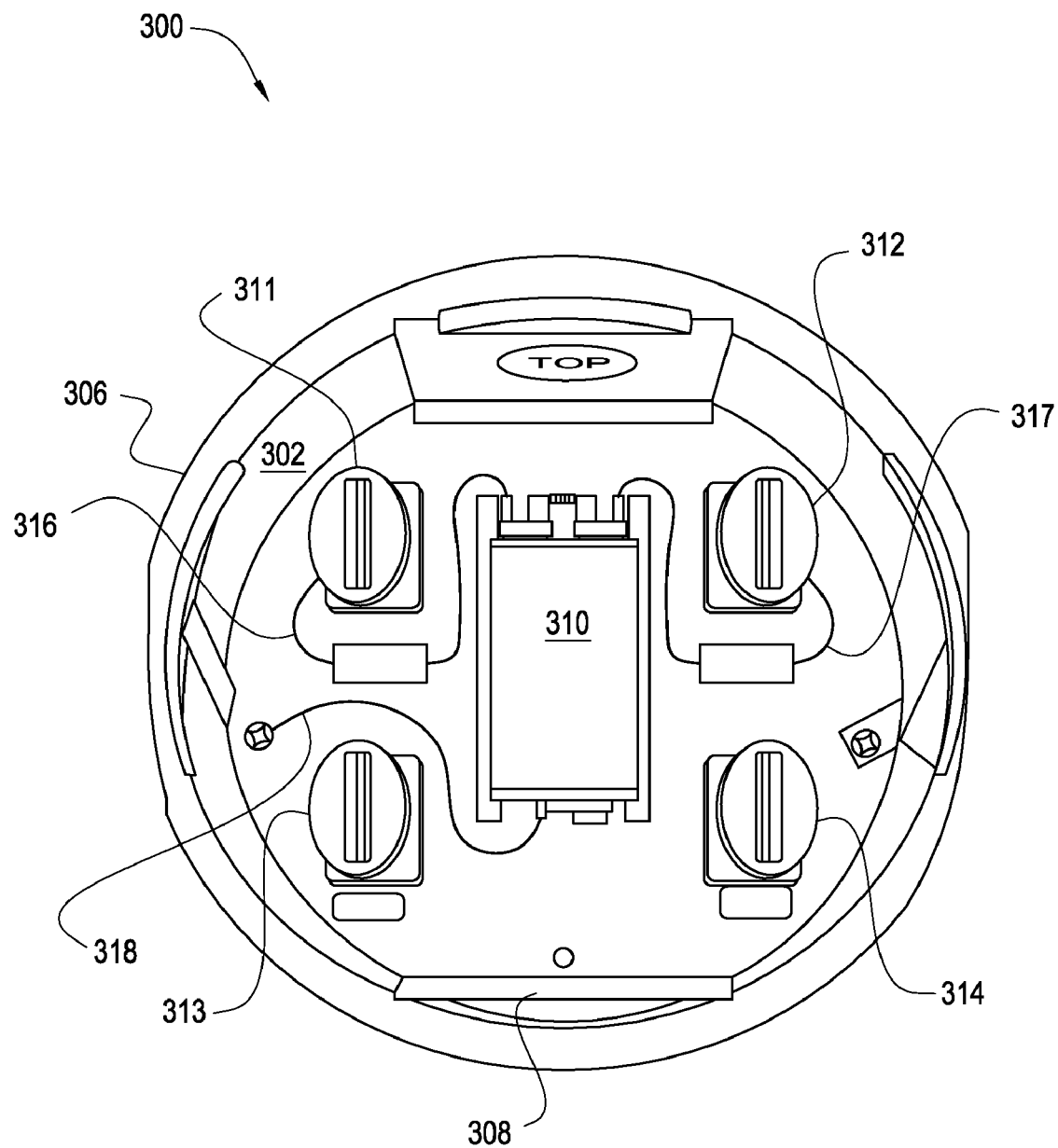
FIG. 3B is a top view diagram of the adapter of FIG. 3A and shows the four jaw sockets used to receive the utility power meter.
Figure 3C:
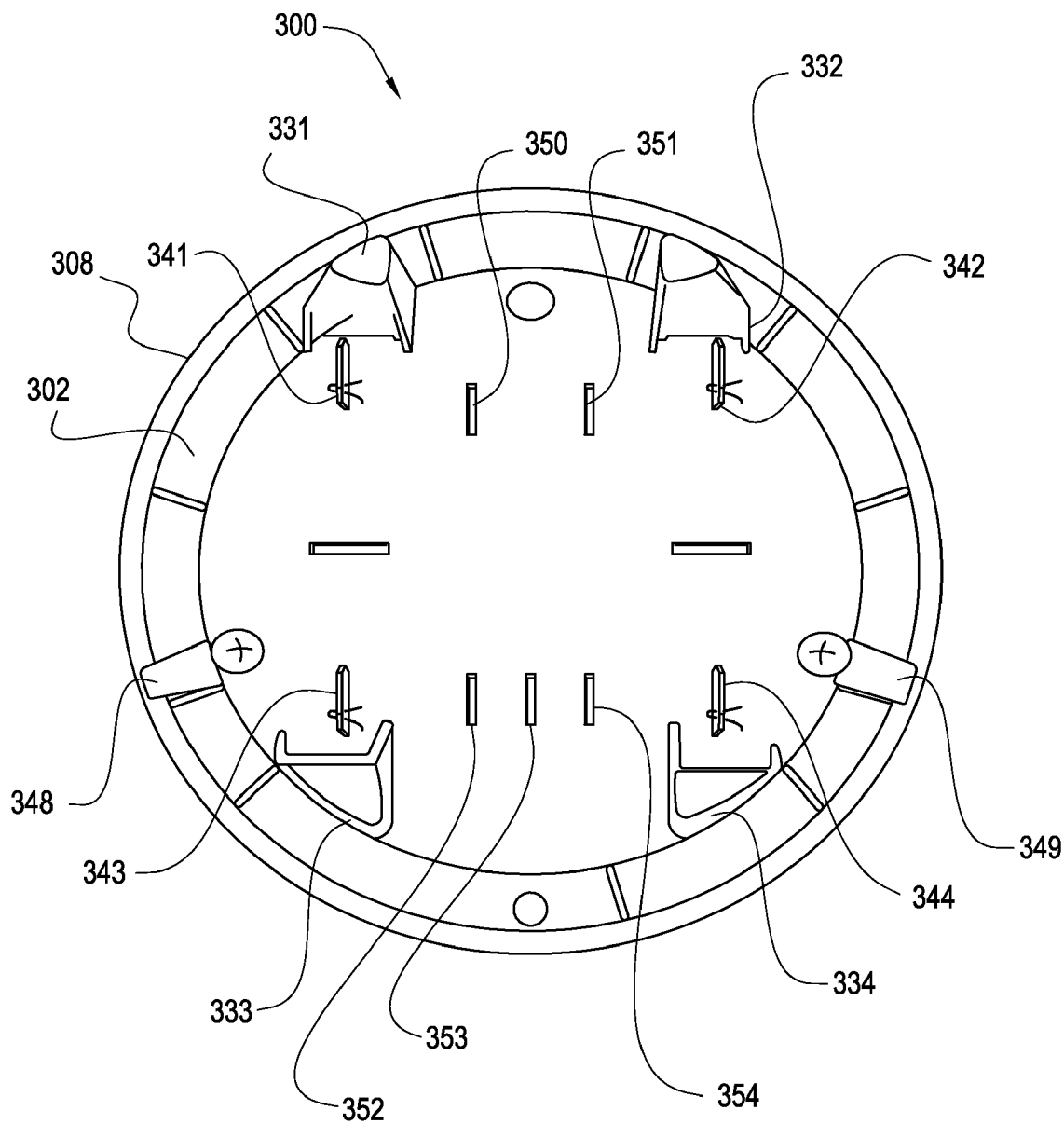
FIG. 3C is a bottom view diagram of the adapter of FIGS. 3A-3B and shows the four jaw blades that plug into the utility power meter socket in the service panels of FIGS. 1-2.

FIGS. 3A-3C represent an adapter embodiment of the present invention, and is referred to herein by the general reference numeral 300. Adapter 300 is typically (but not as a limitation) constructed of heavy duty ABS plastic and sized to fit between a meter socket and its corresponding round glass utility meter. A cylindrical body 302 has a lower flange 304 for a retaining ring to the service panel, and an upper flange 306 for a ring to retain the meter. Grounding straps are typically included around the flanges 304 and 306 to ground the retaining rings.

On the topside, as in FIG. 3B, a set of four socket jaws 311-314 are provided to make the electrical connections to the utility meter inputs and outputs. Wires 316-317 connect the capacitor 310 to the service panel below through jaw blades.

On the underside of adapter 300, as in FIG. 3C, bosses 331-334 guide and jaw blades 341-344 plug into the socket jaws provided for a utility meter in a service panel. Ground straps 348-349 prevent meter retaining rings from electrically floating and prevent a hazard. Spare slots 350-354 are typical of places more jaw blades and socket jaws could be installed, e.g., in three phase arrangements.

Figure 4:
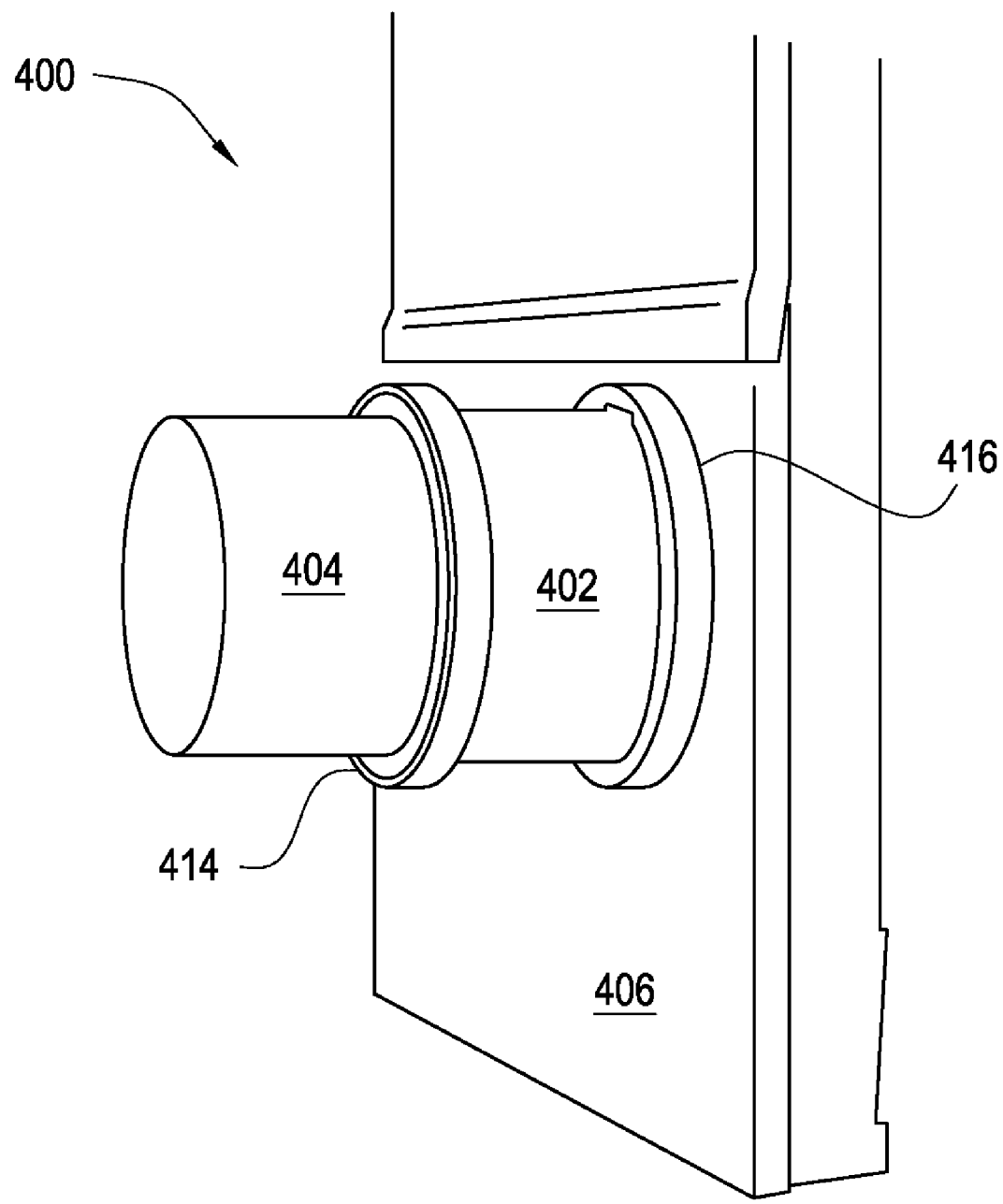
FIG. 4 is a perspective diagram of a service panel, meter, and adapter mounted in a typical service side configuration together on a wall.
Figure 5:
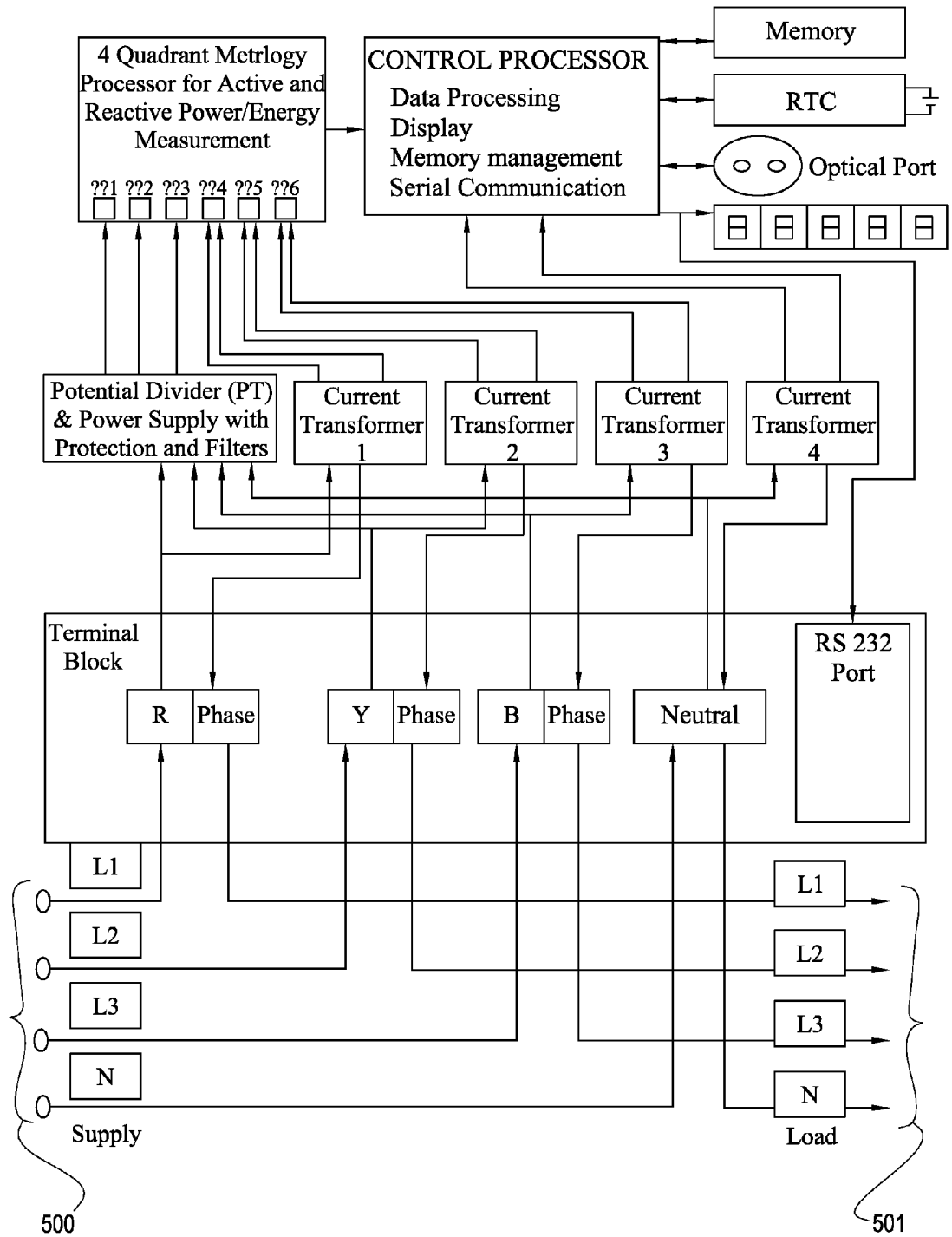
FIG. 5 depicts a schematic of a typical polyphase power meter.
Figure 6:
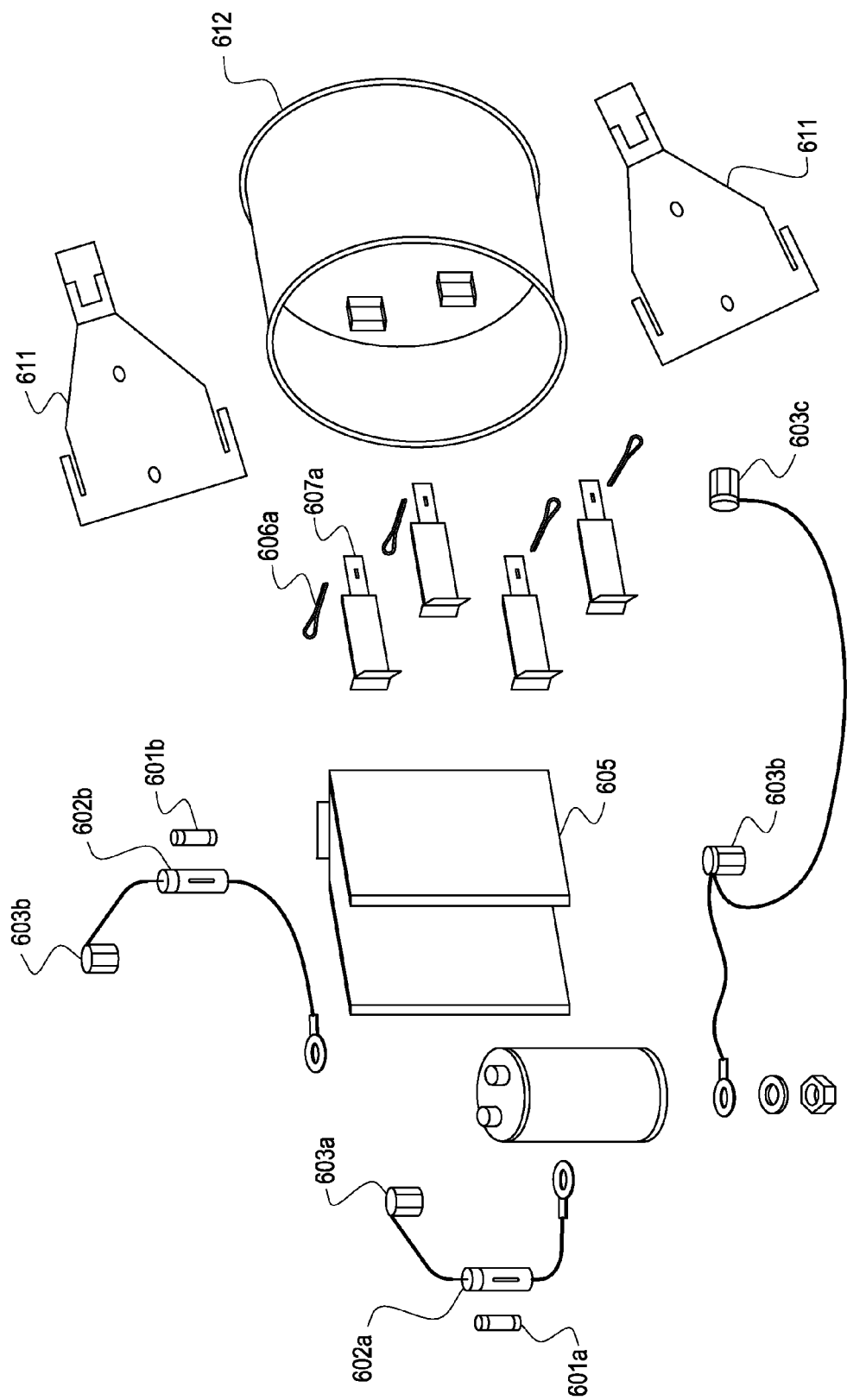
FIG. 6 depicts an exploded view of the adapter.
Figure 7:
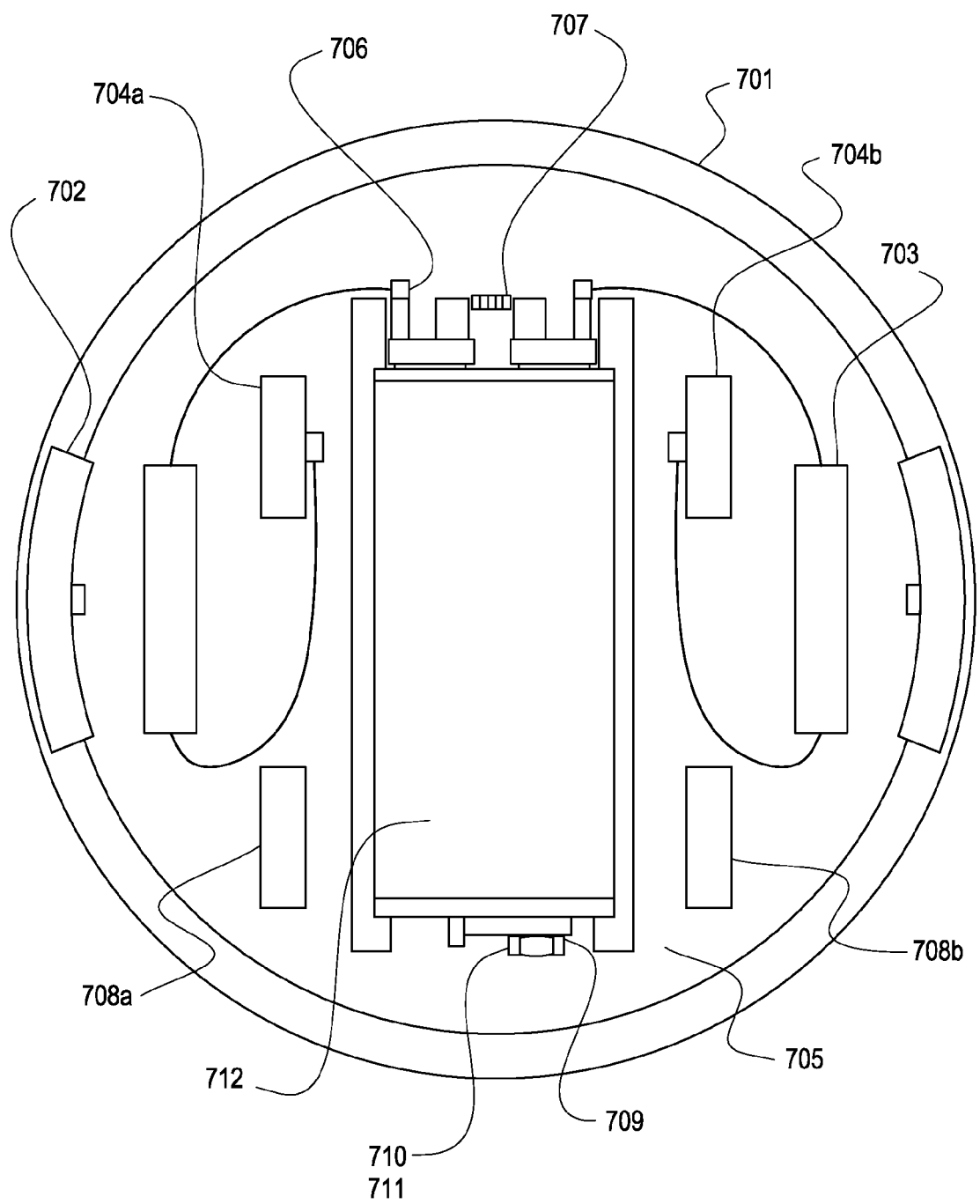
FIG. 7 depicts a top assembly view of the adapter.

FIG. 4 shows a principal advantage of using the adapters and methods of the present invention in the later installation of a power factor correcting adapter in a facility with pre-existing electrical service. An installation 400 uses a supply side adapter 402 inserted between a power meter 404 and a pre-existing wall-mounted service panel 406. A retainer ring 414 secures the meter 404 to the adapter 402, and another retainer ring 416 secures the adapter 402 to the service panel 406. The usual practice is to install lead or plastic tamper seals by the utility to expose any attempts at tampering or theft of electrical services.

The invention also comprises a method for determining the capacitance value for installation. The following steps are generally followed. Although they are listed in a particular order in this description, it should be understood that the sequence of the steps of the method may be interchanged.

The adapter of the invention ("panel units") is typically not used until it has been determined that there is no cost-effective solution by installing to individual motor loads within the facility. Any motor loads that are cost effective to do at the individual motor load should be done there, and installed, or at least the sizing units still hooked up to in order to approach the panel units (if there are custom units to be installed, they have to be done prior to any panel units being sized). A panel unit should not be sized when it expected that additional capacitors are to be added to any of the individual loads connected to that panel. Once all the capacitors are installed on the loads of the system that are attached to the panel, the capacitance can be sized.

A first step is to gather the materials and equipment required, which are:

a. a power factor meter that will measure power factor on the type of panel that's being sized. Single phase=power quality meter or power harmonics meter. Three-phase=power harmonics meter.

b. Panel units for the type of panel that the equipment will be installed in.

A second step is to make a determination about the type of panel units that will be used for the initial test based on the number of phases in the panel and the size of the main breaker. A panel unit typically has a model number that begins with "PU-" and then ends with a number where the left most digit represents the number of phases and the balance of the digits represent the size of the main breaker.

A panel unit should be installed using a breaker that is rated within limits of the wire gauge coming out of the panel unit. By way of example, consider a PU-1200. The gauge of the wire coming out of a PU-1200 can sustain up to 30 amps. As a result a PU-1200 can be installed on a 30 amp breaker or less. The breaker should be greater than 135% of the operating amps of the capacitor. A PU-1200 will draw approximately 6 amps thus a breaker for use with a PU-1200 should be rated at 8 amps or greater. A 20 or 30 amp breaker for the PU1200 is typical. A preliminary measurement should be taken of the power factor and a determination made of how many devices are connected at the highest voltage available from the panel. For most facilities the highest voltage will be 240 VAC.

A next step is to determine how many loads on the panel are inductive. Purely resistive loads, such as a hot water heater, are switched off during this step. An amp probe is used to ensure that none of the resistive loads are on, skewing the results of the power factor measurement. This can be done by either turning off the breakers of those types of equipment or using an amp probe to confirm that there is no current on the load side of those breakers.

A next step is to measure the power factor to determine what is the typical power factor for that panel. For a typical normal residence, the adapter will install on a 240 VAC panel so the voltage needs to be measured between the two phases (there is no neutral used on the adapter unit so there is no neutral used in the power factor measurement). There is no electrical connection on the neutral, therefore the power factor measurements will be made by checking the amps on one of the phases along with the volts from phase-to-phase. The power factor will be a very high number if all the significant inductive loads are off.

A next step is to turn on a 240 V inductive load such as an air-conditioner system or a pool pump. A measurement is made to determine the power factor for this state, for example 0.80. If the power factor stays in the 0.90 s then there may be no benefit to adding the adapter for that user. The savings that may be realized will be reduced for those facilities that already have a high power factor, for example, greater than 0.90.

If a determination is made that the adapter of the invention can be a benefit to this facility, the next step would be to temporarily install a panel unit (PU) based on the main breaker size and the number of phases for that panel. The PU should be installed in a temporary fashion to a circuit breaker on the panel on which it is to be installed. This allows tests to be done to see what impact the adapter will have on that panel/electrical system. The process to make a determination is to measure the power factor on the power lines coming to the main breaker while a test inductive load is on, such as a pool pump or an air conditioner, and see that the power factor is 0.95 or better. It is not desirable to have a leading power factor for any given inductive load.

Next, a measurement is made with multiple 240 V inductive loads. Ideally, the power factor will remain in the 0.90 s with even two loads on. If this is the case, then the correct adapter for the panel has been chosen. A choice may be made to go to a larger or smaller panel unit, based on the test results. If there is a leading power factor at a time when it is not desired (for a single inductive load) the panel unit should be downsized. If there is a lagging power factor below what was expecting during the operation of any single piece of equipment it may be determined that a larger capacity panel unit is required. Once the determination of which panel unit needs to be installed is completed, the system should be powered down and the panel units should receive a permanent installation, meeting all local codes. Then the panel should be closed up and the equipment should be verified that that adapter unit has all appropriate indication lights lit or unlit as is necessary based on the type of unit installed.

The above method may also be extended to a three-phase application.

As a first step, equipment is gather as described above. Next, a determination is made regarding the type of panel unit that will be used for the initial test based on the number of phases from the panel and the size of the main breaker. Panel Units have a model number that begins with "PU-" and then ends with a number where the first digit represents the number of phases and the balance of the digits represent the size of the main breaker. To be installed in accordance with UL and the National Electrical Code (NEC), a panel unit should be installed using a breaker that has a rating within limits of the wire gauge coming out of the panel unit. For an example: consider a PU-3I 00. The gauge of the wire coming out of a PU-3I 00 can operate up to 30 amps. As a result a PU-31 00 can be installed on a 30 amp breaker or less. The breaker has to be greater than 135% of the operating amps of the capacitor. All 3 phase units have fuses in them. As a result they may be installed on a breaker or a disconnect switch, again, making sure that it is done in compliance with local code(s). A PU-3I 00 will draw approximately 5 amps thus a breaker should be rated at 7.5 amps or greater. This is why a 20 or 30 amp breaker for the PU-31 00 is typical. A preliminary measurement should be taken of the power factor and a determination made of how many devices are connected at the highest voltage available from the panel. If the greatest inductive loads are 3 phase, a 3 phase panel unit would be used. If the greatest inductive loads are 208 single phase, more care must be used for sizing. A determination needs to be made if the inductive loads are across just one phase to phase source or multiple, and how balanced the loads are.

In an ideal situation, the greatest inductive load would be from a three-phase device. The power factor should be measured before and after installing the adapter. The preferred procedure is to turn off as many of the loads as possible, then make a power factor measurement with that three-phase load operating. If the power factor is below 0.9 then a PU-3100 would be installed from a temporary hookup.

Next, the power factor would be measured with the device operating again with as few additional loads as possible while the adapter unit is installed. The resulting power factor should be in the upper 0.90's. This should provide the maximum benefit of the KVAR unit for that application. If the greatest inductive load is not on a three-phase circuit, a determination should to be made about how the most optimum solution can be realized. If the greatest loads are single phase 208, then single phase panel units or sizing equipment may be necessary. For example, the greatest load may be air-conditioning equipment that is single phase. To obtain the single phase service typically what happens is the load is connected across any two phases. This can usually be determined by looking at what the panel has attached for loads and which loads are single phase and which loads are three-phase. If the greatest inductive load is between two phases, it should be sized the same way a single phase panel unit is. The adapter unit would then be installed on a breaker that's connected to those two phases.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A power factor correcting utility meter socket adapter, comprising:
   a round cylindrical body sized to fit a standard utility power meter, and having top and bottom flanges for retainers to secure the adapter to said utility power meter and a service panel;
   a set of socket jaws comprising a first socket jaw and a second socket jaw in a topside of the body for connection to said utility power meter, and a corresponding set of jaw blades in a bottom of the body for connection to said service panel; and
   a power factor correcting circuit element having a first terminal and a second terminal and being mounted inside of the round cylindrical body, and wherein said first terminal is electrically connected to said first socket jaw, and wherein said second terminal is electrically connected to said second socket jaw.

2. The adapter of claim 1, wherein the power factor correcting circuit element is a capacitor.

3. The adapter of claim 2, further comprising a first over current protection circuit element having a first terminal and a second terminal, wherein said over current protection device is electrically in series with said first terminal of said capacitor and said first socket jaw.

4. The adapter of claim 3, further comprising a second over current protection circuit element having a first terminal and a second terminal, wherein said over current protection device is electrically in series with said second terminal of said capacitor and said second socket jaw.

5. The adapter of claim 1, wherein the power factor correcting circuit element is a plurality of capacitors.

6. The adapter of claim 5, further comprising a first over current protection circuit element having a first terminal and a second terminal, wherein said over current protection device is electrically in series with said first terminal of said plurality of capacitors and said first socket jaw.

7. The adapter of claim 6, further comprising a second over current protection circuit element having a first terminal and a second terminal, wherein said over current protection device is electrically in series with said second terminal of said plurality of capacitors and said second socket jaw.

8. The adapter of claim 1, further comprising a first over current protection circuit element having a first terminal and a second terminal, wherein said over current protection device is electrically in series with said first terminal of said power factor correcting circuit element and said first socket jaw.

9. The adapter of claim 8, further comprising a second over current protection circuit element having a first terminal and a second terminal, wherein said over current protection device is electrically in series with said second terminal of said power factor correcting circuit element and said second socket jaw.

* * * * *